(12) United States Patent
Matsumoto et al.

(10) Patent No.: US 10,204,661 B2
(45) Date of Patent: Feb. 12, 2019

(54) SEMICONDUCTOR DEVICE

(71) Applicant: Toshiba Memory Corporation, Tokyo (JP)

(72) Inventors: Manabu Matsumoto, Yokohama Kanagawa (JP); Isao Ozawa, Chigasaki Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 64 days.

(21) Appl. No.: 14/635,909

(22) Filed: Mar. 2, 2015

(65) Prior Publication Data
US 2015/0380061 A1 Dec. 31, 2015

(30) Foreign Application Priority Data

Jun. 30, 2014 (JP) .................................. 2014-134515

(51) Int. Cl.
*H05K 1/18* (2006.01)
*G11C 5/02* (2006.01)
(Continued)

(52) U.S. Cl.
CPC .............. *G11C 5/025* (2013.01); *G11C 29/08* (2013.01); *G11C 29/1201* (2013.01);
(Continued)

(58) Field of Classification Search
CPC ......... H05K 1/144–1/148; H05K 2201/10734; H01L 2224/48091
(Continued)

(56) References Cited

U.S. PATENT DOCUMENTS 5,773,880 A 6/1998 Ohno
6,734,539 B2 * 5/2004 Degani ................. H01L 23/552
257/659
(Continued)

FOREIGN PATENT DOCUMENTS

JP H06169058 A 6/1994
JP H08236693 A 9/1996
(Continued)

OTHER PUBLICATIONS

Taiwan Office Action dated May 16, 2016, filed in Taiwan counterpart Application No. 104106705, 15 pages (with translation).
(Continued)

*Primary Examiner* — Tuan T Dinh
(74) *Attorney, Agent, or Firm* — Kim & Stewart LLP

(57) ABSTRACT

A semiconductor device includes a printed circuit board having a first surface and a second surface on a side opposite to the first surface. First pads are on the first surface of the printed circuit board. An interface part is mounted on the printed circuit board via the first pads and is configured to transfer a signal between the interface part and a host device. Second pads are also on the first surface and insulated from the interface part. A semiconductor memory and a controller are mounted on the first surface. First solder balls electrically connect the first pads and the controller. Second solder balls electrical connect the second pads and the controller. A plurality of third pads are disposed on the second surface and electrically connected to the second pads allowing direct connections to the controller and memory via the second pads.

9 Claims, 11 Drawing Sheets

(51) Int. Cl.

| | |
|---|---|
| *H01L 25/18* | (2006.01) |
| *G11C 29/08* | (2006.01) |
| *G11C 29/12* | (2006.01) |
| *H05K 1/02* | (2006.01) |
| *H05K 1/11* | (2006.01) |
| *H01L 23/31* | (2006.01) |
| *H01L 23/00* | (2006.01) |
| *H01L 25/065* | (2006.01) |
| *G11C 16/04* | (2006.01) |

(52) U.S. Cl.
CPC ........... *H01L 25/18* (2013.01); *H05K 1/0268* (2013.01); *H05K 1/113* (2013.01); *G11C 16/0483* (2013.01); *H01L 23/3128* (2013.01); *H01L 24/32* (2013.01); *H01L 24/48* (2013.01); *H01L 24/73* (2013.01); *H01L 25/0657* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/73265* (2013.01); *H01L 2225/0651* (2013.01); *H01L 2225/06506* (2013.01); *H01L 2225/06562* (2013.01); *H01L 2924/00014* (2013.01); *H01L 2924/15311* (2013.01); *H01L 2924/181* (2013.01); *H05K 2201/10159* (2013.01); *H05K 2201/10734* (2013.01)

(58) Field of Classification Search
USPC .................. 361/760–764, 767–790, 803; 257/686–730, 787–790; 174/259–264
See application file for complete search history.

(56) References Cited

U.S. PATENT DOCUMENTS

| | | | | |
|---|---|---|---|---|
| 6,828,665 B2* | 12/2004 | Pu | ....................... | H01L 23/3128 257/686 |
| 7,224,052 B2* | 5/2007 | Nishizawa | ............. | G06K 19/07 257/679 |
| 7,429,786 B2* | 9/2008 | Karnezos | ................ | H01L 24/97 257/686 |
| 7,750,482 B2* | 7/2010 | Pendse | .................. | H01L 21/563 257/685 |
| 8,102,657 B2* | 1/2012 | Hiew | .................... | G06F 1/1632 361/737 |
| 8,653,645 B2* | 2/2014 | Yamaoka | ............ | H01L 23/5286 257/686 |
| 8,664,656 B1 | 3/2014 | Arnold et al. | | |
| 2001/0010397 A1 | 8/2001 | Masuda et al. | | |
| 2004/0085796 A1 | 5/2004 | Tatsumi | | |
| 2006/0050488 A1* | 3/2006 | Goodwin | ................. | G11C 5/04 361/749 |
| 2007/0295982 A1 | 12/2007 | Ryu et al. | | |
| 2009/0063895 A1* | 3/2009 | Smith | .................. | G06F 3/0607 714/6.32 |
| 2010/0052132 A1* | 3/2010 | Baek | ...................... | H01L 23/481 257/686 |
| 2012/0018885 A1 | 1/2012 | Lee et al. | | |
| 2012/0210049 A1 | 8/2012 | Nagahara et al. | | |
| 2014/0097513 A1* | 4/2014 | Lee | ................... | H01L 23/49816 257/528 |

FOREIGN PATENT DOCUMENTS

| | | |
|---|---|---|
| JP | 2000260772 A | 9/2000 |
| JP | 2002164633 A | 6/2002 |
| JP | 2002198630 A | 7/2002 |
| JP | 2004158098 A | 6/2004 |
| JP | 2005222228 A | 8/2005 |
| JP | 2007213212 A | 8/2007 |
| JP | 2011217383 A | 10/2011 |

OTHER PUBLICATIONS

Japanese Office Action dated May 23, 2017, filed in Japanese counterpart Application No. 2014-134515, 11 pages (with translation).

* cited by examiner

SEMICONDUCTOR DEVICE

CROSS-REFERENCE TO RELATED APPLICATION

This application is based upon and claims the benefit of priority from Japanese Patent Application No. 2014-134515, filed Jun. 30, 2014, the entire contents of which are incorporated herein by reference.

FIELD

Embodiments explained herein relate generally to a semiconductor device.

BACKGROUND

Conventionally, there has been provided a memory card which includes a controller and a semiconductor memory, and there has been a demand for a semiconductor device whose performances may be easily checked.

BRIEF SUMMARY OF DESCRIPTION

Figure 1:
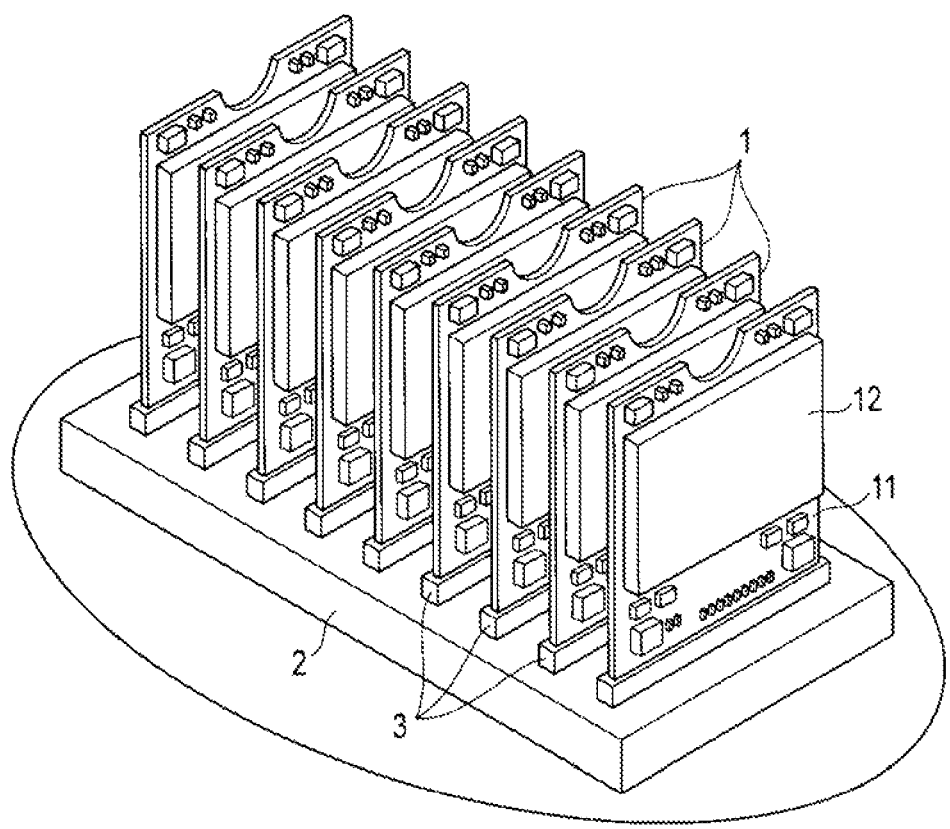
FIG. 1 is a perspective view illustrating a semiconductor device according to a first embodiment.

According to an embodiment, there is provided a semiconductor device whose performances may be easily tested.

According to an embodiment, a semiconductor device includes a printed circuit board having a first surface and a second surface opposite the first surface. An interface part is mounted on the printed circuit board. The interface part is configured to transfer a signal between the interface part and a host device. A plurality of first pads are disposed on the first surface of the printed circuit board and electrically connected to the interface part. A plurality of second pads are also disposed on the first surface of the printed circuit board, but electrically insulated from the interface part. A semiconductor memory is mounted on the first surface along with a controller configured to control the semiconductor memory. A plurality of first solder balls are on the first pads and electrically connect the controller and the first pads. A plurality of second solder balls are on the second pads and electrically connect the controller and the second pads. A plurality of third pads is disposed on the second surface of the printed circuit board and the third pads are electrically connected to the plurality of second pads, respectively.

In general, according to one embodiment, a semiconductor device includes: a printed circuit board; a first pad; a semiconductor package; and a second pad. The printed circuit board has a first surface and a second surface positioned on aside opposite to the first surface. The first pad is mounted on the first surface of the printed circuit board. The semiconductor package includes: a controller; and a solder ball electrically connected to the controller and mounted on the first pad. The second pad is mounted on the second surface of the printed circuit board and is electrically connected to the first pad.

DETAILED DESCRIPTION

Hereinafter, embodiments are explained by reference to drawings.

In this disclosure, with respect to some structural elements, a several different names/labels/expressions are used for expressing each structural element. However, these expressions are merely examples, and it is not denied that each of the above-mentioned structural elements is expressed using other expressions. Further, the structural elements which are not expressed using a plurality of expressions may be also expressed using different expressions.

The drawings are schematic or conceptual views and hence, the relationship between thicknesses and sizes, a ratio of thicknesses of the respective layers and the like are not necessarily equal to those of an actual semiconductor device. Further, even when identical parts are represented in the drawings, the sizes or ratios of sizes of these parts may differ.

First Embodiment

FIG. 1 to FIG. 11 illustrates a semiconductor device 1 according to a first embodiment. The semiconductor device 1 is one example of "semiconductor module" and "semiconductor memory device". Although the semiconductor device 1 according to this embodiment is an SSD (Solid State Drive), the semiconductor device 1 is not limited to the SSD.

The semiconductor device 1 according to this embodiment is a relatively small-sized module. One example of a profile size of the semiconductor device 1 is 22 mm×30 mm. Though, of course, the size of the semiconductor device 1 is not limited to such a size, and the configuration of this embodiment is suitably applicable to modules having various other sizes.

As illustrated in FIG. 1, the semiconductor device 1 may be used in a state where the semiconductor device 1 is mounted on a host device 2, such as a server, for example. The host device 2 has a plurality of connectors 3 (for example, slots) which open upwardly, for example. A plurality of semiconductor devices 1 is respectively connected to the connectors 3 of the host device 2. The plurality of semiconductor devices 1 are supported on the host device 2 in a posture where the plurality of semiconductor devices 1 are vertically erected and are disposed parallel to each other. In such a configuration, the plurality of semiconductor devices 1 may be collectively mounted on the host device 2 in a compact manner and hence, the host device 2 may be small-sized. The semiconductor device 1 may be a device which is used as a storage device for an electronic device such as a notebook-type portable computer or a tablet-type terminal, for example.

Figure 2:
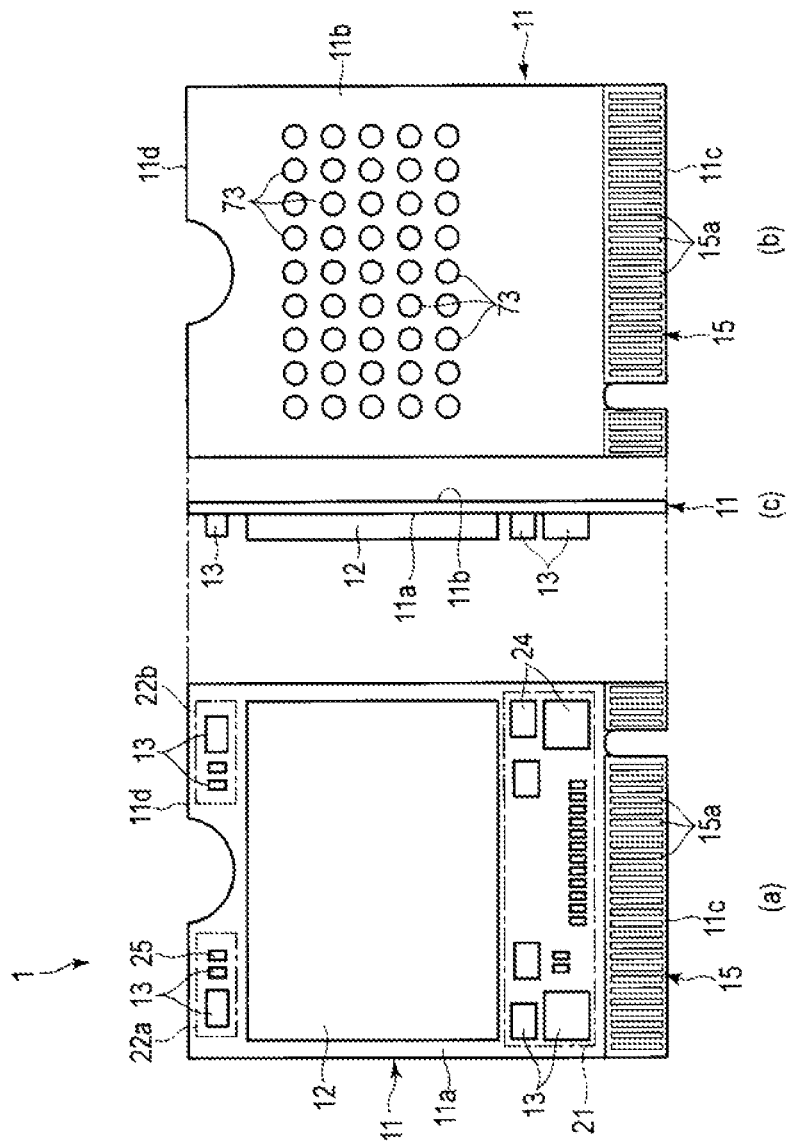
FIG. 2 is a view illustrating the semiconductor device illustrated in FIG. 1.

FIG. 2 illustrates one specific example of the semiconductor device 1. In FIG. 2, section (a) of FIG. 2 is a plan view of the semiconductor device 1, section (b) of FIG. 2 is a bottom plan view of the semiconductor device 1, and section (c) of FIG. 2 is a side view of the semiconductor device 1. As illustrated in FIG. 2, the semiconductor device 1 includes: a printed circuit board 11; a semiconductor package 12; and a plurality of electronic components 13.

The printed circuit board 11 is a printed circuit board having a substantially rectangular shape, for example, and defines a profile size of the semiconductor device 1. The printed circuit board 11 has a first surface 11a and a second surface 11b positioned on a side opposite to the first surface 11a (e.g., front and back surfaces of the printed circuit board). The first surface 11a forms a component mounting surface on which the semiconductor package 12 and the electronic components 13 are mounted. The printed circuit board 11 of this embodiment is a single-sided printed circuit mounting board, for example, where all components including the semiconductor package 12 and the electronic components 13 are mounted on the first surface 11a. On the other hand, the second surface 11b is a component non-mounting surface where components are not mounted. Due to such a configuration, a thickness of the semiconductor device 1 may be decreased.

The printed circuit board 11 includes a first end portion 11c and a second end portion 11d positioned on a side opposite to the first end portion 11c. The first end portion 11c includes an interface part 15 (a board interface part, a terminal part, a connecting part). The interface part 15 includes a plurality of connection terminals 15a (metal terminals), for example. The interface part 15 is inserted into and is electrically connected to the connector 3 of the host device 2. The interface part 15 performs transmission and reception of signals (control signals and data signals) between the interface part 15 and the host device 2.

The interface part 15 of this embodiment is an interface which conforms to the standard of PCI Express (hereinafter referred to as PCIe), for example. That is, high speed signals (high speed differential signals) which conform to the PCIe standards flow between the interface part 15 and the host device 2. The interface part 15 may be an interface which conforms to other standards, for example. A power source is supplied to the semiconductor device 1 from the host device 2 through the interface part 15.

As illustrated in FIG. 2, the first surface 11a of the printed circuit board 11 includes a first component mounting region 21 and a pair of second component mounting regions 22a, 22b, for example. The first component mounting region 21 is positioned between the semiconductor package 12 and the interface part 15. The second component mounting regions 22a, 22b are positioned between the semiconductor package 12 and the second end portion 11d of the printed circuit board 11.

The electronic components 13 mounted on the printed circuit board 11 may be a power source component 24 (power source IC), a temperature sensor 25, capacitors, resistors and the like. The power source component 24 is mounted on the first component mounting region 21, for example. The power source component 24 is a DC-DC converter, for example, and generates a predetermined voltage necessary for the semiconductor package 12 from a power source supplied from the host device 2. The temperature sensor 25 is mounted on the second component mounting region 22a, for example. The disposition of these components is not limited to the above-mentioned example, and various positional modifications are contemplated with respect to the disposition of these components.

The semiconductor package 12 according to this embodiment is a SiP (System in Package) type module where a plurality of semiconductor chips is sealed in a single package. To explain in more detail, the semiconductor package 12 is a so-called BGA-SSD (Ball Grid Array-Solid State Drive) where a plurality of semiconductor memory chips and a controller are integrally formed as one BGA type package.

Figure 3:
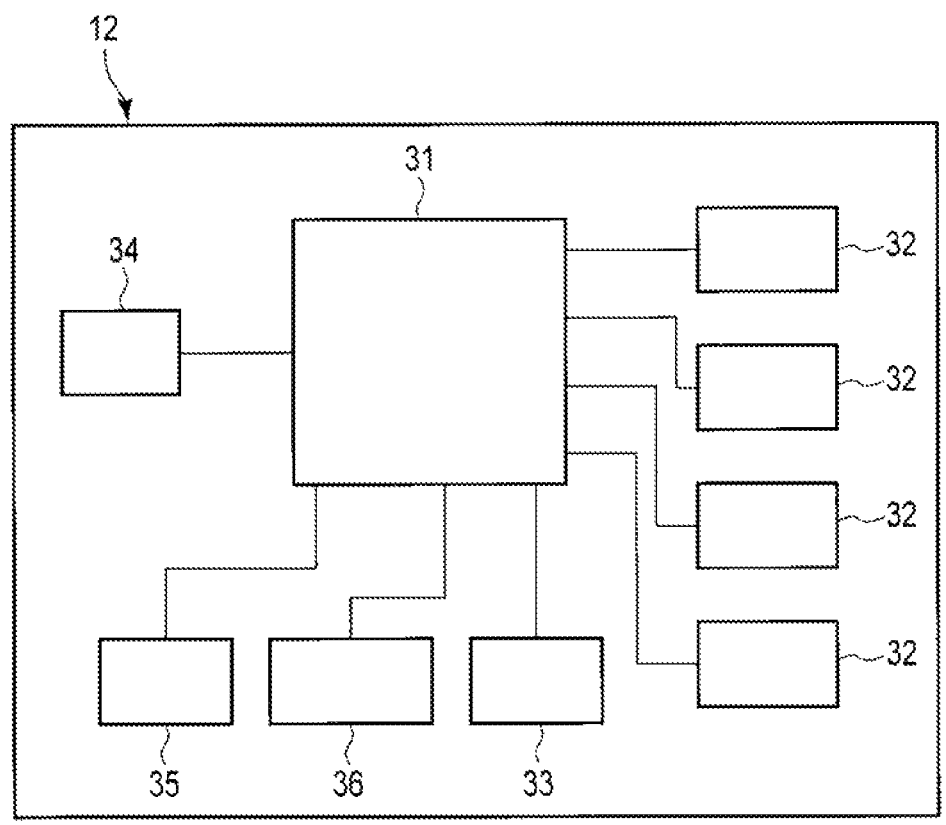
FIG. 3 is a block diagram illustrating the system configuration of a semiconductor package illustrated in FIG. 2.

FIG. 3 illustrates one example of the system configuration of the semiconductor package 12. The semiconductor package 12 includes: a controller 31; a plurality of semiconductor memories 32; a DRAM 33 (Dynamic Random Access Memory); an oscillator 34 (OSC); an EEPROM 35 (Electrically Erasable and Programmable ROM); and a temperature sensor 36.

The controller 31 controls the operation of the plurality of semiconductor memories 32. That is, the controller 31 controls writing, reading and erasing of data on the plurality of semiconductor memories 32. The plurality of semiconductor memories 32 are respectively formed of a NAND memory (NAND type flash memory), for example. The NAND memory is one example of a non-volatile memory. The DRAM 33 is one example of a volatile memory, and is used for storing management information for the semiconductor memory 32 or for caching data.

The oscillator 34 supplies operation signals having a predetermined frequency to the controller 31. The EEPROM 35 stores a control program and the like as fixed information. The temperature sensor 36 detects a temperature in the semiconductor package 12 and informs the controller 31 of the temperature.

Figure 4:
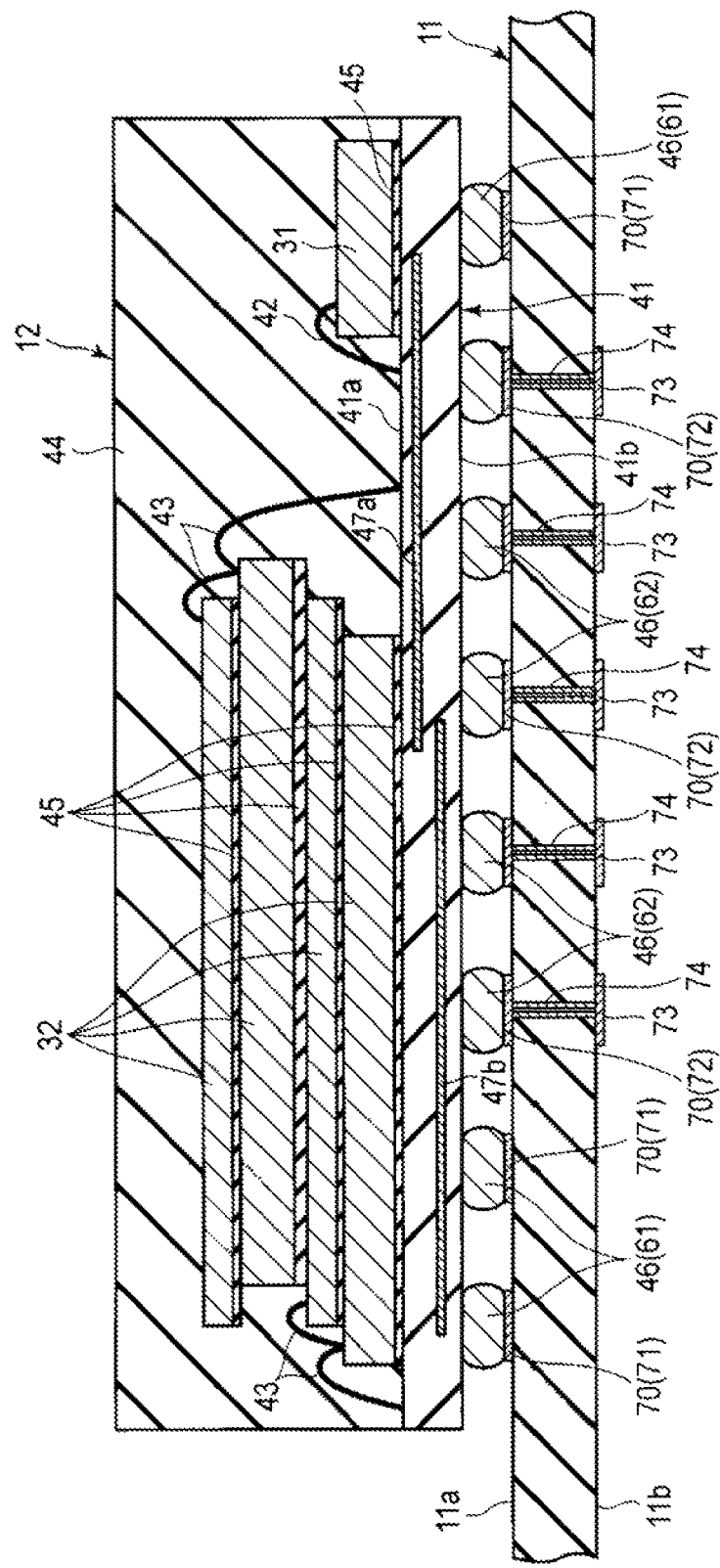
FIG. 4 is a cross-sectional view illustrating the semiconductor device illustrated in FIG. 1.

FIG. 4 illustrates a cross section of the semiconductor package 12. The semiconductor package 12 includes: a printed circuit board 41 (package board); the controller 31; the plurality of semiconductor memories 32; bonding wires 42, 43; a sealing portion 44; mount films 45; and a plurality of solder balls 46.

The printed circuit board 41 is a multi-layered printed circuit board, for example, and includes a power source layer 47a and a ground layer 47b. The printed circuit board 41 has a first surface 41a and a second surface 41b positioned on a side opposite to the first surface 41a. The controller 31 is mounted on the first surface 41a of the printed circuit board 41, for example, and is fixed to the printed circuit board 41 by mount film 45. The controller 31 is electrically connected to the printed circuit board 41 through the bonding wire 42.

The plurality of semiconductor memories 32 are laminated on the first surface 41a of the printed circuit board 41. The plurality of semiconductor memories 32 are fixed to the printed circuit board 41 by the mount films 45, and are electrically connected to the printed circuit board 41 through the bonding wires 43. The semiconductor memories 32 are electrically connected to the controller 31 through the printed circuit board 41. As depicted in FIG. 4, the semiconductor memories 32 are in a stacked arrangement on the first surface 41a of the printed circuit board.

The sealing portion 44 (e.g., molded material) is formed on the first surface 41a of the printed circuit board 41. The sealing portion 44 collectively seals (integrally covers) the controller 31, the plurality of semiconductor memories 32, the bonding wires 42, 43, the DRAM. 33, the oscillator 34, the EEPROM 35, and the temperature sensor 36.

As illustrated in FIG. 4, the plurality of solder balls 46 is mounted on the second surface 41b of the printed circuit board 41. The plurality of solder balls 46 is disposed on the second surface 41b of the printed circuit board 41 in a matrix array, for example. It is not always necessary to dispose the plurality of solder balls 46 over the entire second surface 41b of the printed circuit board 41, and the solder balls 46 may be disposed on only a region or portion of the second surface 41b of the printed circuit board 41.

Figure 5:
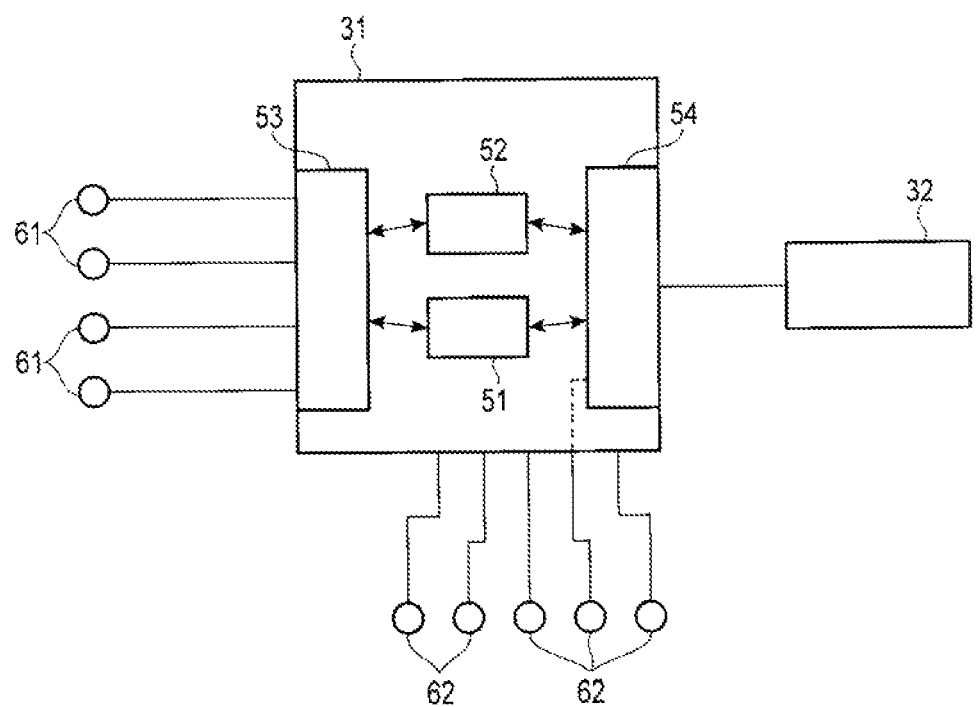
FIG. 5 is a block diagram illustrating the system configuration of a controller illustrated in FIG. 4.

FIG. 5 illustrates one example of the system configuration of the controller 31. As illustrated in FIG. 5, the controller 31 includes: a buffer 51; a Central Processing Unit 52 (CPU); a host interface part 53; and a memory interface part 54.

The buffer 51 temporarily stores a fixed amount of data when data transmitted from the host device 2 is written to the semiconductor memory 32. The buffer 51 also temporarily stores a fixed amount of data when data is read from the semiconductor memory 32 for transmission to the host device 2.

The CPU 52 performs comprehensive control of the semiconductor package 12 and the semiconductor device 1. The CPU 52, for example, receives a write command, a read command or an erase command from the host device 2 and gets access to a region of the semiconductor memory 32 corresponding to the received command. The CPU 52 also controls data transfer processing through the buffer 51.

The host interface part 53 is positioned between the interface part 15 of the printed circuit board 11 and both the CPU 52 and the buffer 51. The host interface part 53 performs interface processing between the controller 31 and the host device 2. PCIe high speed signals flow between the host interface part 53 and the host device 2, for example.

The memory interface part 54 is positioned between the semiconductor memory 32 and both the CPU 52 and the buffer 51. The host interface part 53 performs interface processing between the controller 31 and the semiconductor memory 32.

The plurality of solder balls 46 mounted on the semiconductor package 12 include a plurality of first solder balls 61 and a plurality of second solder balls 62. The plurality of first solder balls 61 is electrically connected to the inside of the controller 31 through the host interface part 53. A control signal or a data signal flows into some first solder balls 61 from the host device 2 in response to a PCIe high speed signal. A power source current is supplied to some other first solder balls 61.

For example, the first solder balls 61 into which the signals flow are disposed on the second surface 41b of the printed circuit board 41 at a position closer to the interface part 15 of the printed circuit board 11 than to the center of the semiconductor package 12. Due to such a disposition, a length of wiring between the first solder ball 61 and the interface part 15 of the printed circuit board 11 may be shortened and hence, high-speed operability of the semiconductor package 12 may be enhanced.

On the other hand, the plurality of second solder balls 62 is not connected to the host interface part 53. The plurality of second solder balls 62 is electrically connected to the inside of the controller 31 not via the host interface part 53.

The second solder balls 62 form input terminals for testing of the semiconductor package 12.

To explain in more detail, at least one second solder ball 62 may be electrically connected to the memory interface part 54 in the controller 31 in a manner not via the host interface part 53. That is, for example, when the electrical connection in the controller 31 is switched at the time of performing the testing operation of the semiconductor package 12, at least one second solder ball 62 is electrically connected to the memory interface part 54 not via the host interface part 53, for example.

From another viewpoint, at least one second solder ball 62 may be electrically connected to the memory interface part 54 in the controller 31 not via the CPU 52 and the buffer 51. That is, for example, when the electrical connection in the controller 31 is switched at the time of performing the testing operation of the semiconductor package 12, at least one second solder ball 62 is electrically connected to the memory interface part 54 not via the CPU 52 and the buffer 51, for example.

As illustrated in FIG. 4, the first surface 11a of the printed circuit board 11 includes a plurality of pads 70 on which the solder balls 46 of the semiconductor package 12 are mounted respectively. The plurality of pads 70 includes a plurality of first pads 71 and a plurality of second pads 72. The first pads 71 are electrically connected to the interface part 15 of the printed circuit board 11. The first solder balls 61 of the semiconductor package 12 are mounted on the first pads 71. The second pads 72 are electrically insulated from the interface part 15 of the printed circuit board 11. The second solder balls 62 of the semiconductor package 12 are mounted on the second pads 72.

As illustrated in FIG. 2 and FIG. 4, the second surface 11b of the printed circuit board 11 includes a plurality of third pads 73. The plurality of third pads 73 are disposed corresponding to the disposition of the plurality of second pads 72. That is, the size and the disposition of the plurality of third pads 73 are substantially equal to the size and the disposition of the plurality of second pads 72, for example. In other words, the third pads 73 are positioned directly below the second pads 72. The plurality of third pads 73 are positioned on a side opposite to a region of the printed circuit board 11 covered with the semiconductor package 12.

Figure 6:
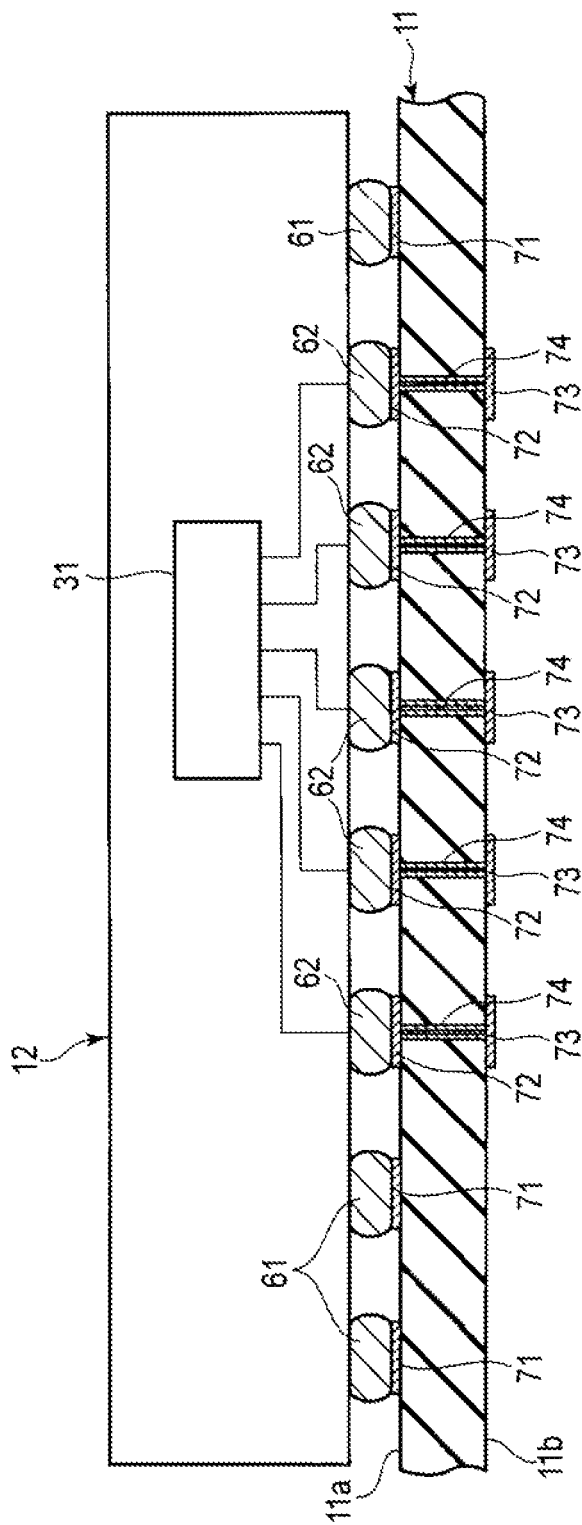
FIG. 6 is a cross-sectional view schematically illustrating the electrical connection relationship in the semiconductor device illustrated in FIG. 1.

FIG. 6 schematically illustrates the electrical connection relationship between the printed circuit board 11 and the semiconductor package 12. The printed circuit board 11 includes connecting portions 74 which electrically connect the plurality of second pads 72 and the plurality of third pads 73 to each other on a one-to-one basis. The connecting portion 74 is a through hole connector or a via, for example. The plurality of third pads 73 are electrically connected to the plurality of second pads 72 respectively through the through holes or the vias. That is, each one of the plurality of third pads 73 is electrically connected to the controller 31 through the connecting portion 74, the second pad 72 and the second solder ball 62.

The third pads 73 are one example of "test pads". That is, when the test of the semiconductor device 1 is performed, a test command (test signal) is inputted to the controller 31 through the third pads 73. For example, by inputting a test command to the controller 31 through the third pads 73 and by acquiring a response from the third pads 73, it is determined whether or not writing of data into the semiconductor memory 32 or reading of data from the semiconductor memory 32 is normally performed.

To explain in more detail, the controller 31 and the semiconductor memory 32 may be respectively operated as a single unit based on a test command inputted from at least one third pad 73, for example. With respect to the semiconductor device 1, by inputting various test commands to the third pad 73, it is possible to perform a function check or a reliability check such as a check on whether or not the controller 31 is normally operated, a check on whether or not the semiconductor memory 32 is normally operated, a check on whether or not a power source of the semiconductor package 12 is normally functioned, and a check on whether or not the semiconductor package 12 normally functions as a whole.

In this embodiment, the number of third pads 73 is larger than the number of first pads 71. Twenty or more third pads 73 are formed on the second surface 11b of the printed circuit board 11, for example. Due to such a configuration, many kinds of test commands may be inputted to the controller 31 so that further finer tests may be performed.

In this embodiment, a test mode of the semiconductor device 1 includes a first mode and a second mode, for example. The first mode is a mode where a single unit test of the controller 31 may be performed. On the other hand, the second mode is a mode where the electrical connection in the controller 31 is switched so that at least one third pad 73 is electrically connected to the memory interface part 54 neither via the CPU 52 nor the buffer 51, for example. That is, the second mode is a mode where an access path which allows a direct access to the semiconductor memory 32 from at least one third pad 73 is set so that a single unit test of the semiconductor memory 32 may be performed.

Figure 7:
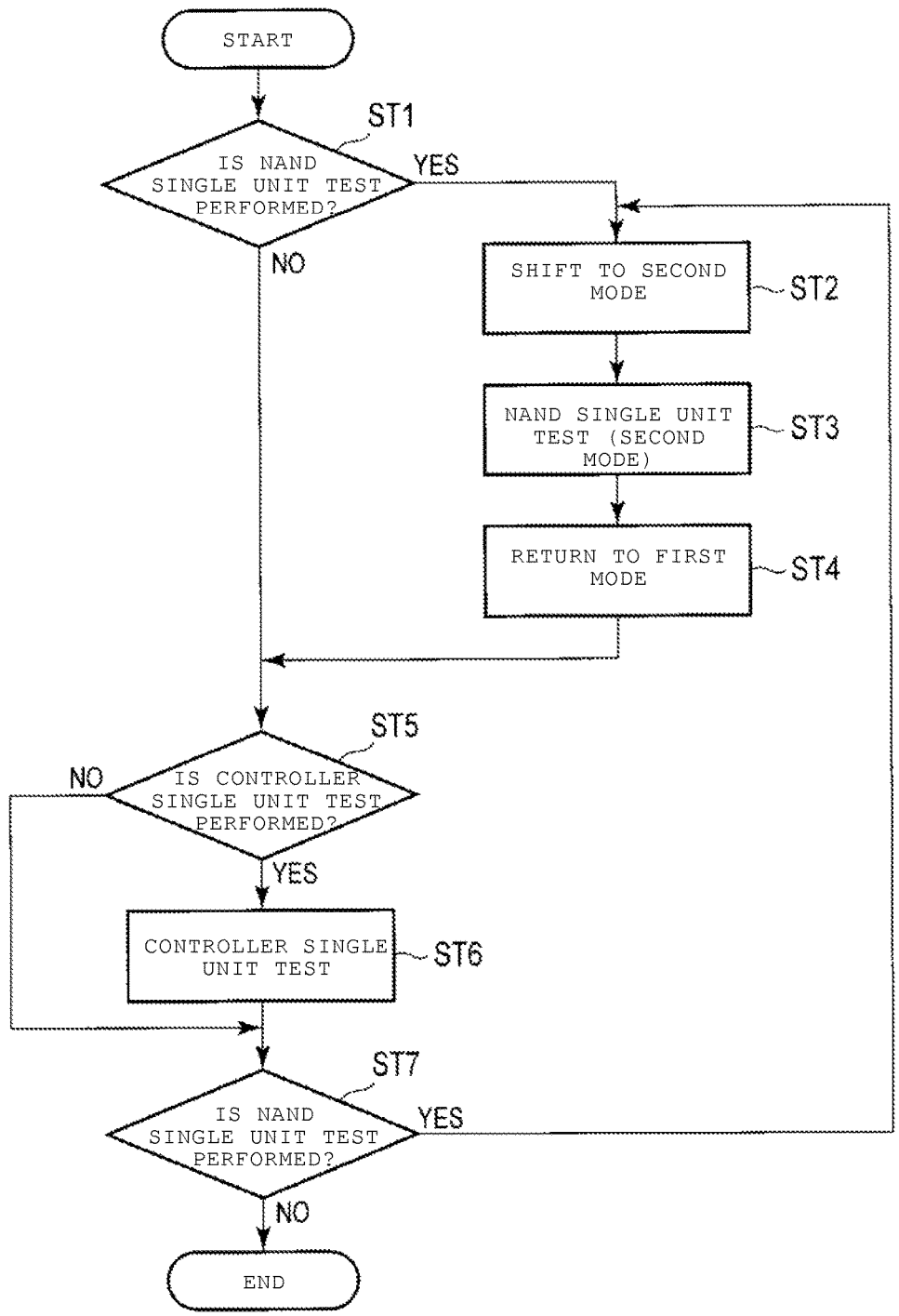
FIG. 7 is a flowchart illustrating one example of a test operation of the semiconductor device illustrated in FIG. 1.

FIG. 7 illustrates one example of the flow of the test operation of the semiconductor device 1.

Firstly, the controller 31 determines whether or not a single unit test of the semiconductor memory 32 is performed in step ST1. When the single unit test of the semiconductor memory 32 is performed (step ST1: YES), the processing advances to step ST2. When the single unit test of the semiconductor memory 32 is not performed (step ST1: NO), the processing advances to step ST5.

In step ST1, the controller 31 sets the operation mode of the controller 31 to the second mode. The processing advances to step ST3 when the operation mode of the controller 31 is set to the second mode. The single unit test of the semiconductor memory 32 is performed in step ST3. In the single unit test of the semiconductor memory 32, for example, write data is inputted from the third pad 73, read data is acquired from the same third pad 73 or from the third pad 73 different from the third pad 73 from which write data is inputted, and the consistency of write data and read data is confirmed. By performing such operations, it is determined whether or not the semiconductor memory 32 has a defect.

As a result, a defect such as a bit where erroneous data is held (failure bit) in the semiconductor memory 32 or a bit where neither writing of data nor reading of data into or from the semiconductor memory 32 is performed (bad block) is determined.

When the single unit test of the semiconductor memory 32 is finished, the processing advances to step ST4. In step ST4, the controller 31 returns the operation mode of the controller 31 to the first mode. When the operation mode of the controller 31 is returned to the first mode, the processing advances to step ST5. In step ST5, it is determined whether or not the single unit test of the controller 31 is to be performed. When the single unit test of the controller 31 is to be performed (step ST5: YES), the processing advances to step ST6. When the single unit test of the controller 31 is not to be performed (step ST5: NO), the processing advances to step ST7.

In step ST6, the semiconductor device 1 performs the single unit test of the controller 31. As one example, a desired command is inputted to the controller 31 from the third pad 73, and a test on whether or not the controller 31 normally responds is performed. The processing advances to step ST7 when the single unit test of the controller 31 is finished.

The controller 31 determines whether or not the single unit test of the semiconductor memory 32 is to be performed in step ST7. When the single unit test of the semiconductor memory 32 is to be performed (step ST7: YES), the processing returns to step ST2. When the single unit test of the semiconductor memory 32 is not to be performed (step ST7: NO), the test operation is finished. The test of the semiconductor device 1 is not limited to the above-mentioned test, and a test of the whole semiconductor package 12 or other test may be performed.

Figure 8:
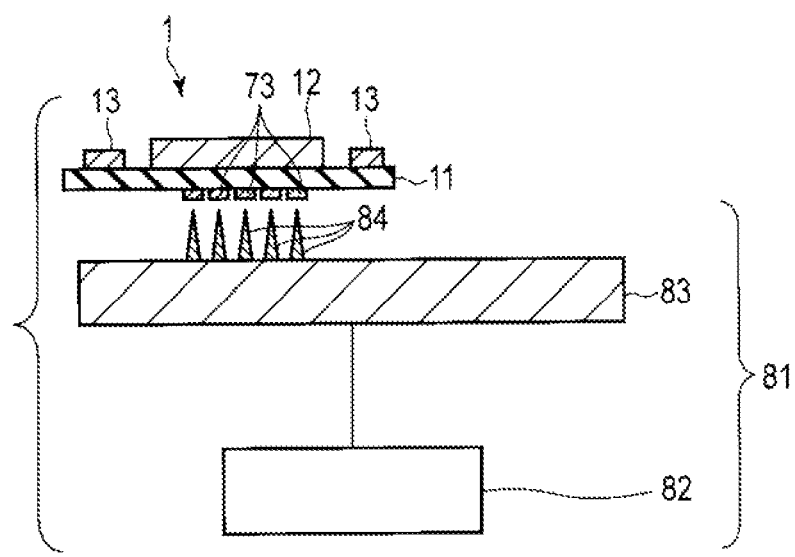
FIG. 8 is a cross-sectional view schematically illustrating a test device for the semiconductor device illustrated in FIG. 1.

FIG. 8 illustrates one example of a test device 81 used for testing the semiconductor device 1. The test device 81 includes: a tester 82; a stage 83; and a plurality of test pins 84 (probes). The tester 82 is connected to the stage 83. The plurality of test pins 84 are disposed on the stage 83 in a protruding manner and are connected to the tester 82 by the stage 83. The plurality of test pins 84 are disposed corresponding to the third pads 73.

In testing the semiconductor device 1, the test pins 84 are brought into contact with the third pads 73. Then, a test command is inputted to the controller 31 from the tester 82 through the third pads 73, and a response from the controller 31 is determined by the tester 82. Plural kinds of tests may be applied to the semiconductor device 1 by exchanging or reconfiguring the tester 82, for example. The test of the semiconductor device 1 may be performed by dividing into a test of the controller 31 and a test of the semiconductor memory 32.

Figure 9:
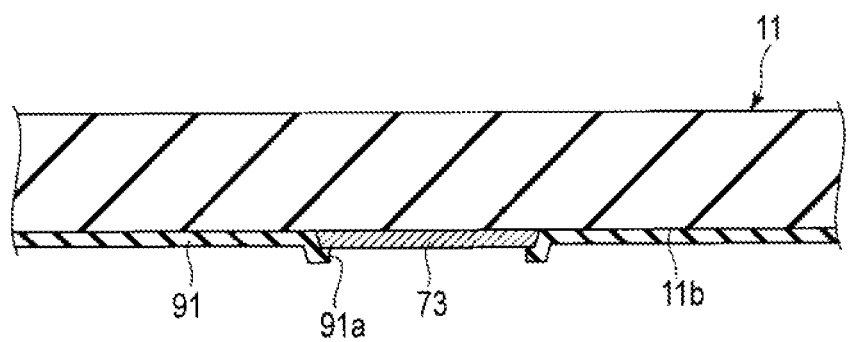
FIG. 9 is a cross-sectional view illustrating an area around a third pad of the semiconductor device illustrated in FIG. 1.

FIG. 9 illustrates one example of the printed circuit board 11. As illustrated in FIG. 9, the third pad 73 may be exposed from an opening portion 91a of a solder resist 91 formed on the second surface 11b of the printed circuit board 11. The solder resist 91 is one example of "insulating layer" or "insulation part".

Figure 10:
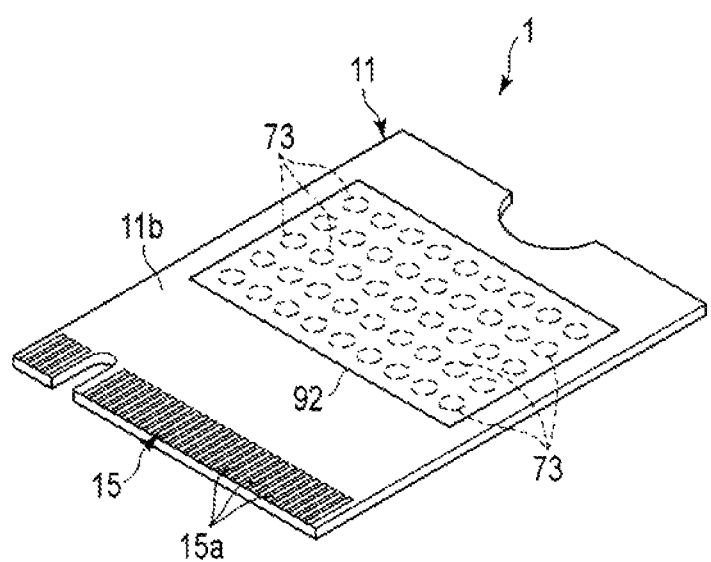
FIG. 10 is a perspective view illustrating a rear surface of the semiconductor device illustrated in FIG. 1.

FIG. 10 illustrates the second surface 11b of the printed circuit board 11. As illustrated in FIG. 10, a label 92 which integrally covers the plurality of third pads 73 may be mounted on the second surface 11b of the printed circuit board 11. The label 92 is one example of "sheet", "insulation sheet" or "insulation part". The label 92 in this embodiment is formed using a material having higher heat conductivity than the solder resist 91, for example. The label 92 is made of carbon graphite, for example.

The third pad 73 is connected to the solder ball 46 of the controller 31 at the connection portion 74, which each have excellent heat conductivity, for example, and hence, a part of heat generated during operation/testing of the controller 31 is liable to be transferred. Accordingly, by providing the label 92 having higher heat conductivity compared to the solder resist 91, for example, heat radiation property of the semiconductor device 1 may be enhanced.

Figure 11:
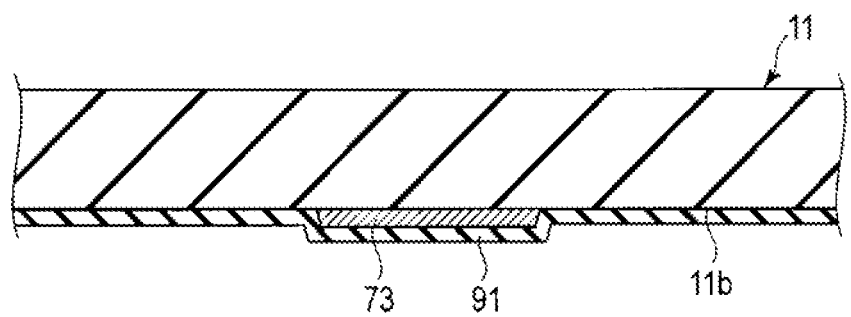
FIG. 11 is a cross-sectional view illustrating an area around a third pad of a modification of the semiconductor device illustrated in FIG. 1.

FIG. 11 illustrates a modification of the printed circuit board 11. As illustrated in FIG. 11, the third pad 73 may be covered with the solder resist 91 formed on the second surface 11b of the printed circuit board 11, and the solder resist 91 may be removed so as to expose the third pad 73 for use/testing. Further, the third pad 73 may be re-covered with the solder resist 91 after the testing is finished, for example.

In the above-mentioned configuration, for the sake of facilitating the explanation, the second pad 72 may be referred to as "first pad" and the third pad 73 may be referred to as "second pad".

According to the semiconductor device 1 having such a configuration, the performance of the semiconductor device 1 and the performances of the respective components incorporated into the semiconductor device 1 may be easily checked. That is, the semiconductor device 1 according to this embodiment includes: the printed circuit board 11; the semiconductor package 12; and the pads 72, 73. The printed circuit board 11 has the first surface 11a, and the second surface 11b positioned on a side opposite to the first surface 11a. The pads 72 are mounted on the first surface 11a of the printed circuit board 11. The semiconductor package 12 includes: the controller 31; and the solder balls 62 which are mounted on the pads 72 and are electrically connected to the controller 31. The pads 73 are mounted on the second surface 11b of the printed circuit board 11, and are electrically connected to the pads 72.

Due to such a configuration, the operation of the controller 31 and the operation of the semiconductor package 12 may be checked by making use of the pads 73 mounted on the second surface 11b of the printed circuit board 11. Accordingly, the reliability of the semiconductor device 1 may be enhanced.

In this embodiment, the semiconductor device 1 includes the interface part 15 which is mounted on the printed circuit board 11 and a signal flows between the interface part 15 and the host device 2. The pads 72, 73 are electrically insulated from the interface part 15. Due to such a configuration, it is possible to directly access to the controller 31 without using the interface part 15 and hence, the test on the controller 31 may be easily performed.

In this embodiment, the controller 31 is operable based on a test command inputted through the pads 73. Due to such a configuration, by inputting various types of test commands to the pads 73, extremely intricate test operations on the semiconductor device 1 may be performed easily. Accordingly, the test on the semiconductor device 1 may be performed easily and the reliability of the test may be enhanced.

In this embodiment, the pads 73 are positioned on a side opposite to a region of the printed circuit board 11 covered with the semiconductor package 12. Due to such a configuration, the positional relationship between the pad 73 and the solder ball 62 of the semiconductor package 12 may be simplified. This simplification of the positional relationship contributes to making the test on the semiconductor device 1 easy and, at the same time, the disposition of the test pins 84 of the test device 81 or the like may be simplified.

The semiconductor device 1 according to this embodiment further includes the insulation part (the label 92 or the solder resist 91) which covers the pad 73. Due to such a configuration, it is possible to prevent an erroneous operation based on erroneous inputting of a signal via the pads 73 when the semiconductor device 1 is in an actual use.

Recently, the further miniaturization, the further reduction of thickness and the further increase of packing density have been requested with respect to the semiconductor device 1. For example, the semiconductor device 1 is requested to have a profile size of 22 mm×30 mm and to be compatible with single-sided mounting configurations.

For a comparison purpose, a semiconductor device is considered where a controller and a semiconductor memory are mounted on a printed circuit board separately. In such a semiconductor device, when a size of the printed circuit board is decreased to some extent, it is difficult to dispose the controller and the semiconductor memory in individual packages. Even if the controller and the semiconductor memory may be mounted in individual packages, it is difficult to mount test pads for testing product performance.

In view of the above, according to this embodiment, the semiconductor package 12 is formed of a so-called SiP part where the semiconductor memory 32 and the controller 31 are collectively sealed by the sealing portion 44. Due to such a configuration, even when a size of the printed circuit board is decreased to some extent, it is possible to dispose the controller 31 and the semiconductor memory 32 with high packing density.

Further, in this embodiment, the printed circuit board 11 is a single-sided printed circuit mounting board where the second surface 11b forms a component non-mounting surface. That is, in this embodiment, the pads 73 for testing are disposed by making use of the component non-mounting surface of the single-sided printed circuit mounting board. Due to such a configuration, the pads 73 may be disposed by making use of a relatively large area and hence, a sufficiently large number of pads 73 may be disposed on the printed circuit board 11. Accordingly, the extremely intricate testing may be performed on the semiconductor device 1. Further, by making use of the relatively large area, the plurality of pads 73 may be disposed at sufficient intervals and hence, the disposition of the test pins 84 of the test device 81, an operation of bringing the test pins 84 into contact with the pads 73 may be simplified.

For example, in this embodiment, the number of third pads 73 is larger than the number of first pads 71. Due to such a configuration, the more detailed testing of the semiconductor device 1 may be performed. Further, in this embodiment, the disposition of the plurality of third pads 73 corresponds directly to the disposition of the plurality of second pads 72. Due to such a configuration, the positional relationship between the pads 73 and the solder balls 62 of the semiconductor package 2 may be further simplified and hence, the test of the semiconductor device 1 may be performed more easily.

For a comparison purpose, a semiconductor device is considered where a line connected to a pad for a test is led out from amongst a plurality of signal lines extending between the interface part 15 and the controller 31 on the printed circuit board 11. According to such a configuration, due to the formation of the line for the test, impedance of the signal lines change and hence, when a high speed differential signal flows, for example, such a change in impedance adversely influences signal quality of the applied signal.

On the other hand, in this embodiment, the controller 31 includes the host interface part 53 connected to the interface part 15 of the printed circuit board 11, and the memory interface part 54 connected to the semiconductor memory 32. At least one of the plurality of third pads 73 is electrically connectable to the memory interface part 54 in the controller 31 not via the host interface part 53. Due to such a configuration, impedance of the signal line between the interface part 15 and the controller 31 on the printed circuit board 11 is not adversely influenced and hence, signal quality of a signal which flows through the signal line may be maintained at a high level.

In this embodiment, the controller 31 includes the CPU 52 and the memory interface part 54, which is electrically connected to the semiconductor memory 32. At least one of the plurality of third pads 73 is electrically connectable to the memory interface part 54 in the controller 31 not via the CPU 52. Due to such a configuration, the memory interface part 54 may be directly accessed and hence, a single unit test of the semiconductor memory 32 may be easily performed and the accuracy of the test may be also enhanced.

Next, the semiconductor device 1 according to a second embodiment and the semiconductor device 1 according to a third embodiment are explained. The configurations having the identical or similar functions as the configuration of the first embodiment are given same symbols, and the explanation of the substantially similar components is omitted. Further, the configurations other than the specific configurations explained below are possible and such configurations may be adapted to the corresponding configurations of the first embodiment.

Second Embodiment

Figure 12:
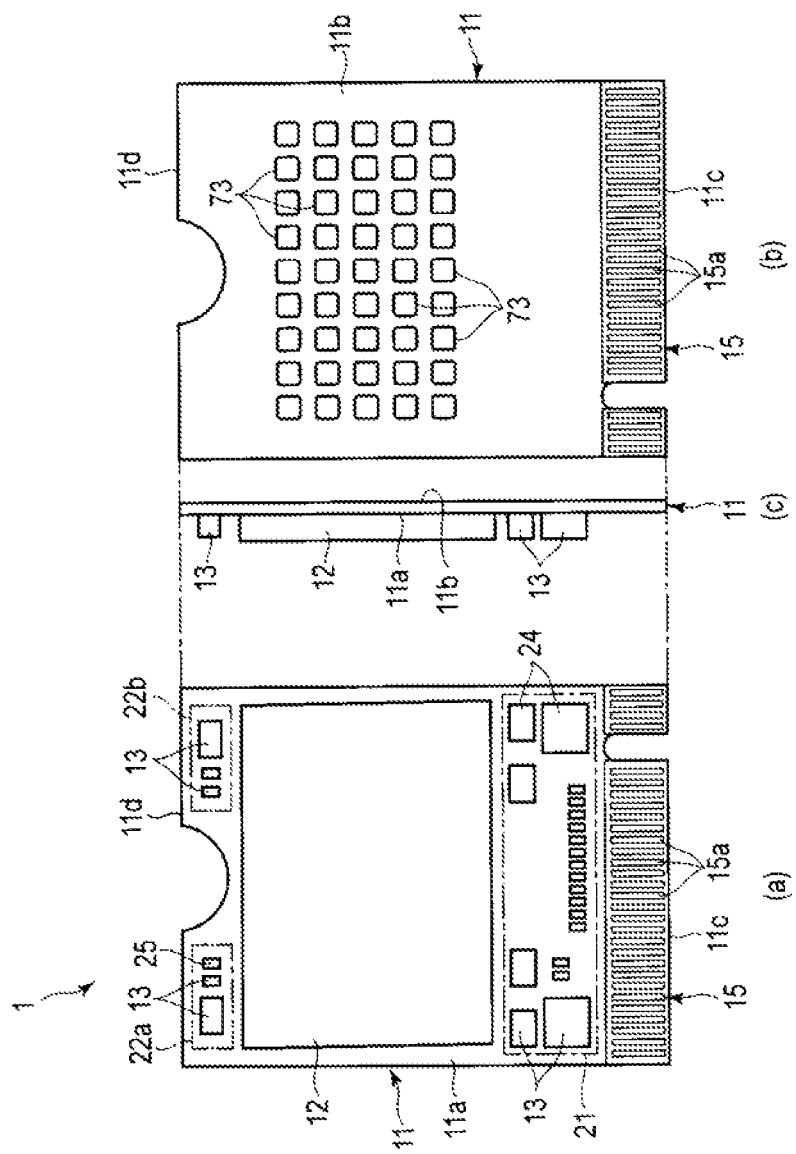
FIG. 12 is a view illustrating a semiconductor device according to a second embodiment.

FIG. 12 illustrates one example of the semiconductor device 1 according to a second embodiment. In FIG. 2, (a) of FIG. 2 is a plan view of the semiconductor device 1, (b) of FIG. 2 is a bottom plan view of the semiconductor device 1, and (c) of FIG. 2 is a side view of the semiconductor device 1. Each one of the plurality of third pads 73 mounted on the printed circuit board 11 according to this embodiment is formed into a substantially rectangular shape with rounded corner portions. Such a configuration may also achieve functions substantially equal to the functions of the configuration according to the first embodiment.

Third Embodiment

Figure 13:
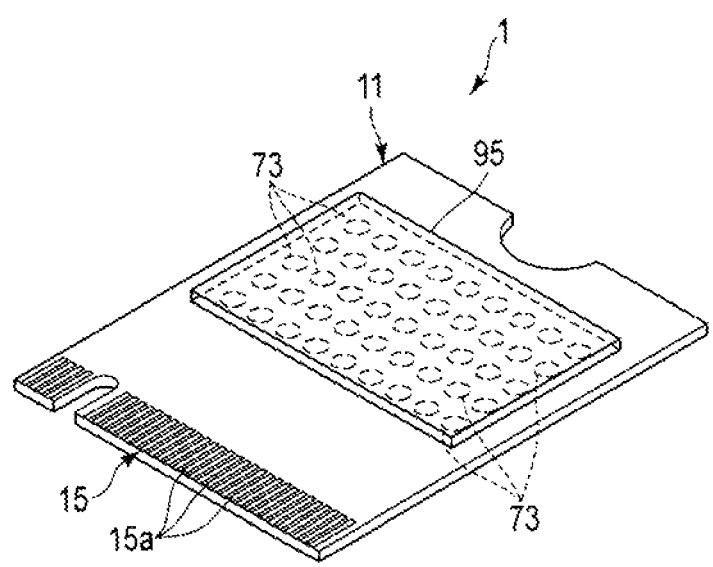
FIG. 13 is a perspective view illustrating a rear surface of a semiconductor device according to a third embodiment.

FIG. 13 illustrates one example of the semiconductor device 1 according to a third embodiment. The semiconductor device 1 according to this embodiment includes a metallic heat radiation plate 95 instead of the label 92. The heat radiation plate 95 exhibits higher heat conductivity than the solder resist 91, for example. For example, the heat radiation plate 95 integrally covers the plurality of third pads 73, and is thermally connected to the third pads 73. Due to such a configuration, the controller 31 and the heat radiation plate 95 may be well connected to each other thermally through second solder balls 62, second pads 72, the connection part 74 and the third pads 73 and hence, heat radiation property of the semiconductor device 1 may be further enhanced.

Although the first to third embodiments and the modifications of these embodiments have been explained heretofore, the present disclosure is not limited to the embodiments of the semiconductor device 1. For example, the controller 31 and the semiconductor memory 32 may be individually mounted on the printed circuit board 11. The number and the disposition of the third pads 73 are not particularly limited, and the present disclosure may be carried out by suitably setting the number and the disposition of the third pads 73 according to requirements for testing of semiconductor device 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a printed circuit board having a first surface and a second surface opposite the first surface;
    a board interface part on the printed circuit board;
    a semiconductor package mounted on the printed circuit board and including a semiconductor memory and a controller configured to control the semiconductor memory;
    a plurality of first pads on the first surface of the printed circuit board and electrically connected to the board interface part, the first pads facing the semiconductor package;
    a plurality of second pads on the first surface of the printed circuit board and electrically insulated from the board interface part, the second pads facing the semiconductor package;
    a plurality of first solder balls between the first pads and the semiconductor package and electrically connecting the first pads to the controller;
    a plurality of second solder balls between the second pads and the semiconductor package and electrically connecting the second pads to the controller; and
    a plurality of third pads on the second surface of the printed circuit board, at least one third pad being electrically connected to the controller via one of the second pads and insulated from the board interface part, wherein
    the controller includes a host interface part connected to the board interface part and a memory interface part connected to the semiconductor memory, and
    at least one third pad in the plurality of third pads is electrically connected to the memory interface part without being connected via the host interface part.

2. The semiconductor device according to claim 1, wherein the plurality of third pads are on the second surface in a region opposite to a region of the printed circuit board that is covered with the semiconductor package.

3. The semiconductor device according to claim 1, wherein the controller is configured to be operated according to a test command inputted via at least one of the plurality of third pads.

4. The semiconductor device according to claim 1, wherein the number of third pads in the plurality of third pads is larger than the number of first pads in the plurality of first pads.

5. The semiconductor device according to claim 1, wherein each third pad in the plurality of third pads respectively corresponds to one second pad in the plurality of second pads.

6. The semiconductor device according claim 1, wherein the controller includes a central processing unit (CPU).

7. The semiconductor device according to claim 1, wherein the plurality of third pads is covered with an insulating layer.

8. The semiconductor device according claim 1, further comprising an insulating sheet integrally covering the plurality of third pads.

9. The semiconductor device according to claim 3, wherein the plurality of third pads is on the second surface in a region opposite a region of the printed circuit board covered with the semiconductor package.

* * * * *